United States Patent
Clark et al.

(10) Patent No.: US 7,952,239 B2
(45) Date of Patent: May 31, 2011

(54) BIMETALLIC STRIPS FOR ENERGY HARVESTING, ACTUATION AND SENSING

(75) Inventors: Arthur E Clark, Adelphi, MD (US); Marilyn Wun-Fogle, Potomac, MD (US); James B Restorff, College Park, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 12/844,559

(22) Filed: Jul. 27, 2010

(65) Prior Publication Data
US 2010/0291403 A1 Nov. 18, 2010

Related U.S. Application Data

(63) Continuation of application No. 12/006,756, filed on Dec. 19, 2007, now Pat. No. 7,834,490.

(60) Provisional application No. 60/882,259, filed on Dec. 28, 2006.

(51) Int. Cl.
*F02B 63/04* (2006.01)
*H01L 41/00* (2006.01)

(52) U.S. Cl. .......................... 310/26; 310/336

(58) Field of Classification Search ............ 290/1 R; 310/26, 334, 330, 331, 339; 148/108, 306, 148/103
See application file for complete search history.

(56) References Cited

U.S. PATENT DOCUMENTS

| | | | |
|---|---|---|---|
| 4,443,729 A * | 4/1984 | Rider | 310/330 |
| 4,754,441 A * | 6/1988 | Butler | 367/157 |
| 5,047,683 A | 9/1991 | Butler et al. | |
| 5,130,953 A | 7/1992 | Grosso | |
| 5,168,760 A | 12/1992 | Wun-Fogle et al. | |
| 5,260,615 A | 11/1993 | Sahashi et al. | |
| 5,629,578 A | 5/1997 | Winzer et al. | |
| 5,742,561 A | 4/1998 | Johnson | |
| 6,229,247 B1 * | 5/2001 | Bishop | 310/328 |
| 6,320,479 B1 | 11/2001 | Alers et al. | |
| 6,563,400 B2 * | 5/2003 | Itasaka et al. | 333/187 |
| 6,570,298 B2 * | 5/2003 | Yasuda | 310/328 |
| 6,570,300 B1 * | 5/2003 | Riedel et al. | 310/363 |
| 7,045,933 B2 * | 5/2006 | Dollgast | 310/328 |

(Continued)

FOREIGN PATENT DOCUMENTS

JP 01122377 A 5/1989

(Continued)

OTHER PUBLICATIONS

Magnetostriction of Stress Annealed Fe-Ga-Al & Fe-Ga Alloys Under Compressive & Tensile Stress, M.Wun-Fogle et al; Smart Structures and Materials 2004.

(Continued)

*Primary Examiner* — Julio Gonzalez
(74) *Attorney, Agent, or Firm* — Dave A. Ghatt

(57) ABSTRACT

Disclosed are bimetallic strips that incorporate magnetostrictive materials to enhance and provide sensing, actuating and energy harvesting functions. The bimetallic strips include a positive magnetostrictive Fe-based alloy layer and a flexible layer. The flexible layer may be a negative magnetostrictive layer or a permanent magnet layer. One or more permanent magnet materials may also be used in the arrangement. The bimetallic strips are inexpensive and easily manufactured, and have characteristics that enhance sensing and actuator applications, and enables energy harvesting.

16 Claims, 4 Drawing Sheets

U.S. PATENT DOCUMENTS

| | | | |
|---|---|---|---|
| 7,173,343 | B2 | 2/2007 | Kugel |
| 7,199,495 | B2 | 4/2007 | Or et al. |
| 2003/0010405 | A1* | 1/2003 | Clark et al. .................. 148/108 |
| 2005/0230974 | A1 | 10/2005 | Masters et al. |

FOREIGN PATENT DOCUMENTS

JP          01122377 A  *  5/1989

OTHER PUBLICATIONS

Tensile Properties of Magnetostrictive Iron-Gallium Alloys R.A. Kellogg et al; Acta Materialia 52 (2004) 5043-5050.

Enhancement of Magnetostrictive Effects for Sensor Applications, M.Wun-Fogle et al; J. Materials Engineering, vol. 11, No. 1, 1989.

Magnetostrictive Thin Film Transducers for Applications in Microsystem Technology, E.Quandt, Institute of Materials Research I, Karlsru, Germany.

Magnetostriction and Magnetic Anisotropy of Field Annealed Metglas* 2605 Alloys via dc M-H Loop Measurements Under Stress, M.L.Spano et al; J. Appl. Phys 53 (3), Mar. 1982.

The Effect of Longitudsinal Stress & Torsional Strain on the Magnetization of Amorphous Magnetoelastic Wires, M. Wun-Fogle et al; Anales De Fisica Serie B, vol. 86, 1990.

Magnetostrictive Properties of Galfenol Alloys Under Compressive Stress, A.E.Clark et al; Materials Transactions, vol. 43, No. 5 (2002).

Magnetic Properties & Mossbauer Investigations of Fe-Ga Alloys, Nobuo Kawamiya, Kengo Adachi & Yoji Nakamura, Journal of the Physical Society of Japan, vol. 33, No. 5, Nov. 1972.

Temperature & Stress Dependencies of the Magnetic & Magnetostrictive Properties of Fe0.81 Ga0.19, R.A.Kellogg et al; Journal of Applied Physic vol. 91, No. 10, May 15, 2002.

Magnetostriction of Ternary Fe-Ga-X Alloys (X=Ni,Mo,Sn,Al), J.B. Restorff et al; Journal of Applied Physics vol. 91, No. 10, May 15, 2002.

Magnetostrictin and Elasticity of Body Centered Cubic Fe100-xBex Alloys, A.E.Clark et al; Journal of Applied Physics, vol. 95, No. 11, Jun. 1, 2004.

Large Magnetostriction in Directionally Solidified FeGa and FeGaAl Alloys, N.Srisukhumbowornchai et al; Journal of Applied Physic, vol. 90, No. 11, Dec. 1, 2001.

Magnetostriction and Elasticity of b.c.c. Fe100-xBex Alloys, A.E. Clark et al; 9th Joint MMM-Intermag Conference, Jan. 5-9, 2004.

Magnetoelasticity of Fe-Ga & Fe-Al Alloys, J.R.Cullen et al; Journal of Magnetism & Magnetic Materials 226-230 (2001) 948-949.

Temperature Dependence of the Magnetic Anisotropy & Magnetostriction of Fe100-xGax(x=8.6,16.6,28.5) A.E.Clark et al; Journal of Applied Physics 97, 10M316 (2005).

Tensile Strength & Non-Axial Auxetic Properties of Fe-Ga Alloys, R.A.Kellogg et al; US Navy Workshop on Acoustic Transduction Mater. & Devices, State College PA May 6-8, 2003.

* cited by examiner

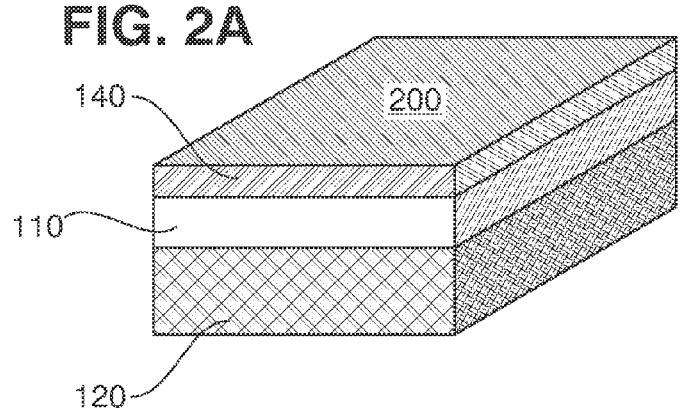
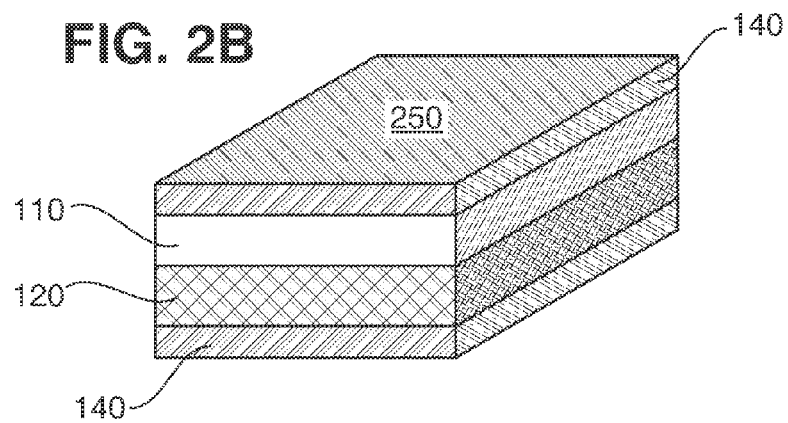
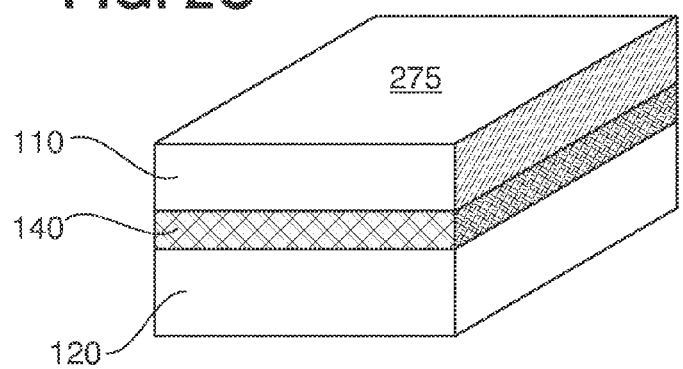

BIMETALLIC STRIPS FOR ENERGY HARVESTING, ACTUATION AND SENSING

CROSS-REFERENCE TO RELATED APPLICATIONS

This is a continuation of U.S. patent application Ser. No. 12/006,756, filed Dec. 19, 2007, now U.S. Pat. No. 7,834,490, which claims the benefit of U.S. Provisional Application No. 60/882,259, filed Dec. 28, 2006, each of which is hereby incorporated by reference.

STATEMENT OF GOVERNMENT INTEREST

The following description was made in the performance of official duties by employees of the Department of the Navy, and, thus the claimed invention may be manufactured, used, licensed by or for the United States Government for governmental purposes without the payment of any royalties thereon.

TECHNICAL FIELD

The following description relates generally to bimetallic strips, more particularly, bimetallic strips that incorporate magnetostrictive materials to enhance and provide sensing, actuating and energy harvesting functions.

BACKGROUND

Bimetallic strips have been extensively used for numerous applications in the past. Such applications include electrical/mechanical actuation and temperature sensing. Typically, bimetallic strips consist of two strips of different metals that have different expansion and heating characteristics. Consequently, when heated, the strips expand at different rates. Typically, the strips are adjacently attached along their length. Because of the different expansion and heating characteristics, one strip bends over the other when heated, so that the bimetallic strip bends in a predictable manner. When cooled, the bimetallic strip bends in the opposite direction.

Because of the above-recited properties, bimetallic strips are used as sensors and actuators. As a sensor, a bimetallic strip can be used to detect changes in temperature, heat, or other environmental conditions. As an actuator, a bimetallic strip may for example, push a switch as it moves, thereby changing the state of a system. In some applications, a bimetallic strip may be provided in a linear form, and in others in curved or coiled form. Generally, bimetallic strips usually comprise materials such as steel and copper. However, it is desirable to have bimetallic strips that are easy to manufacture and are functional in a greater number of working environments.

SUMMARY

In one aspect, the invention is a bimetallic strip. In this aspect, the bimetallic strip includes a first substantially flat layer. According to the invention, the first substantially flat layer includes a positive magnetostrictive material. The bimetallic strip also has a second substantially flat layer attached to the first substantially flat layer forming a dual layered strip. The second substantially flat layer has a flexible material.

In another aspect, the invention is a method of energy harvesting. The method includes the providing of a bimetallic strip having a first end and a second end. The bimetallic strip further includes a first substantially flat layer having a positive magnetostrictive material. According to the method, the magnetostrictive material is an Fe-based alloy having, $Fe_{100-x}Al_x$ wherein x is from about 5 to about 25, or $Fe_{100-y}Ga_y$, wherein y is from about 5 to about 35. The magnetostrictive material may also be formed of a combination of the $Fe_{100-x}Al_x$ and the $Fe_{100-y}Ga_y$. The providing of the bimetallic strip further includes providing a second substantially flat layer attached to the first substantially flat layer forming a dual layered strip. According to the method, the second substantially flat layer has a permanent magnet or a negative magnetostrictive material. The method further includes the attaching of the first end of the bimetallic strip to a first surface, and the attaching the second end of the bimetallic strip to an inertial mass or to a second surface. In this aspect, the method also includes the initiating of a changing magnetic arrangement and accompanying changing magnetic flux in the bimetallic strip by vibrating the first surface to produce a mechanical stress in the bimetallic strip. The method also includes the inducing of an AC voltage from the changing magnetic flux in a coil. This is done by wrapping the coil around the outer surface of the bimetallic strip. The associated induced current is stored or converted into a desired output form.

BRIEF DESCRIPTION OF THE DRAWINGS

Other features will be apparent from the description, the drawings, and the claims.

FIG. 2A is a schematic illustration of a bimetallic strip according to an embodiment of the invention;

FIG. 2B is a schematic illustration of a bimetallic strip according to an embodiment of the invention;

FIG. 2C is a schematic illustration of a bimetallic strip according to an embodiment of the invention;

DETAILED DESCRIPTION

Figure 1A:
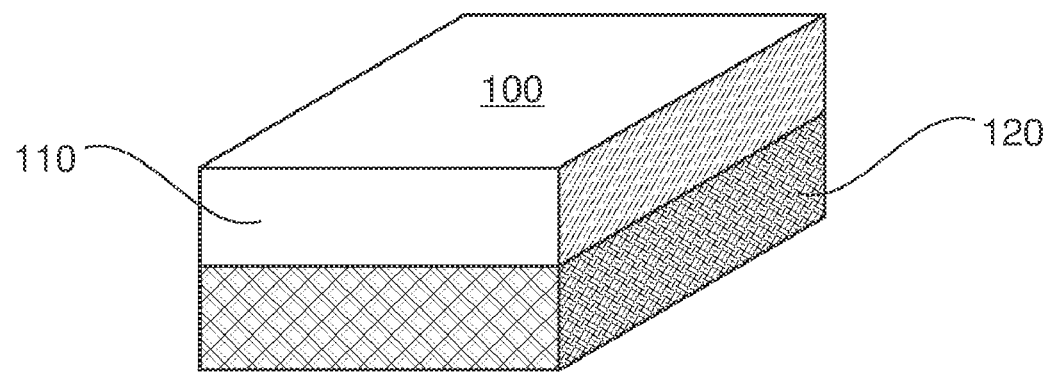
FIG. 1A is a schematic illustration of a bimetallic strip according to an embodiment of the invention.

FIG. 1A is a schematic illustration of a bimetallic strip 100 according to an embodiment of the invention. As shown, the bimetallic strip 100 is a two-layer structure having a first substantially flat layer 110 attached to a second substantially flat layer 120. In this embodiment, the first layer 110 is a metallic strip having positive magnetostrictive properties. The first layer 110 may be an alloy of aluminum (Al) and iron (Fe), preferably $Fe_{100-x}Al_x$, wherein x is from about 5 to about 25. The first layer 110 may also be an alloy of gallium (Ga), preferably $Fe_{100-y}Ga_y$, wherein y is from about 5 to about 35. Alternatively, the first layer 110 may be a combination of $Fe_{100-x}Al_x$, wherein x is from about 5 to about 25, and $Fe_{100-y}Ga_y$, wherein y is from about 5 to about 35.

To maximize the performance of the bimetallic strips in operations such as energy harvesting, actuating, and sensing, alloys having substantial amounts of the above outlined Fe-based Ga and Al alloys may also be used. As such, each of the above outlined Fe-based alloy layers, may optionally include one or more elements as small additions, such as carbon (C), manganese (Mn), sulfur (S), beryllium (Be), or Tin (Sn).

Thus, for example, layer 110 may be a combination of $Fe_{100-x}Al_x$ wherein x is from about 5 to about 25, carbon, and tin. In another example, layer 110 may be a combination of $Fe_{100-y}Ga_y$ wherein y is from about 5 to about 35, and carbon. In yet another example, layer 110 may be a combination of $Fe_{100-x}Al_x$, wherein x is from about 5 to about 25, and $Fe_{100-y}Ga_y$, wherein y is from about 5 to about 35, carbon, and tin. It should be noted that the above outlined Fe-based alloys for layer 110 are merely examples, and other combinations may be used.

The above outlined alloys have desirable properties such as strength, durability, and the ability to be welded. Additionally, the Fe—Al and Fe—Ga based alloys have high magnetostrictive levels that are only weakly dependent on temperature. The manufacture of the above mentioned Fe-based alloys can be readily accomplished because the alloys can be trained by stress annealing and/or magnetic field annealing, and can be inexpensively prepared.

In this embodiment, the second substantially flat layer 120 is a flexible layer. In this embodiment, layer 120 is an alloy having negative magnetostrictive properties. The second layer may be nickel (Ni) or an appropriate Ni alloy, or any other alloy having negative magnetostrictive properties. Ni possesses a magnetostriction of about 50 ppm (negative). Consequently, when the second substantially flat layer 120 is Ni, the magnetostriction of the first Fe-based layer 110 can be readily magnetiostrictively matched to that of Ni by adjusting the amounts of Al or Ga. The bimetallic strip 100 composed of the two magnetostrictively active layers 110 and 120, of the materials outlined above would be inexpensive. The Fe alloy as well as the Ni alloy may be prepared from bar stock, rolled stock, or by melt spinning techniques. The first and second layers 110 and 120 may be joined by means of welding, brazing, soldering, or any other means of adhesion. Although FIG. 1A shows the bimetallic strip 100 being substantially rectangular, the strip may have any shape associated with bimetallic strips in general. It should be noted that the size and the dimensions of the bimetallic strip and its components may vary depending on the application.

Figure 1B:
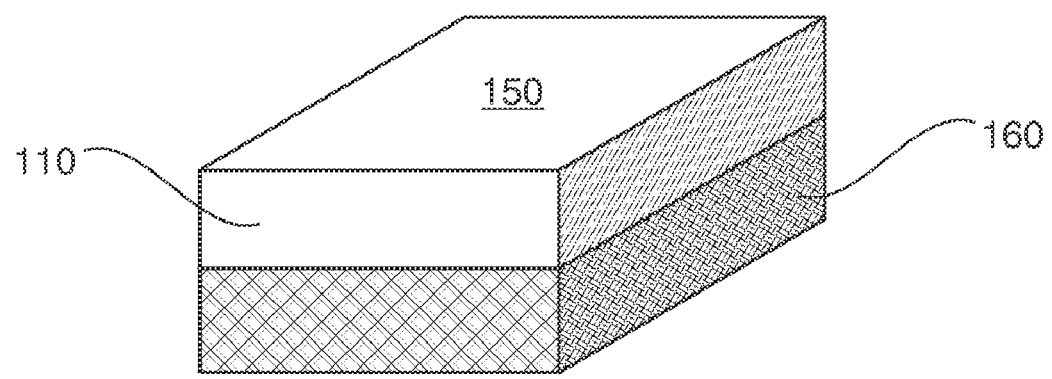
FIG. 1B is a schematic illustration of a bimetallic strip according to an embodiment of the invention.

FIG. 1B is a schematic illustration of a bimetallic strip 150 according to an embodiment of the invention. In this embodiment, the bimetallic strip generally does not require a magnetic bias field to operate properly. As shown in FIG. 1B, the bimetallic strip 150 is a two-layer structure having a first substantially flat layer 110 attached to a second substantially flat layer 160. In this embodiment, the first layer 110 is a metallic strip having positive magnetostrictive properties, as described with respect to the embodiment of FIG. 1A. Thus, as outlined above, the first layer 110 may be $Fe_{100-x}Al_x$, wherein x is from about 5 to about 25, or $Fe_{100-y}Ga_y$, wherein y is from about 5 to about 35, or a combination thereof. With respect to the $Fe_{100-y}Ga_y$, an alloy with a very large magnetostriction of about 400 ppm may be employed. As outlined above, each of the above outlined Fe-based alloy layers, may optionally include one or more additional elements, such as for example, carbon (C), manganese (Mn), sulfur (S), beryllium (Be), or Tin (Sn).

The second layer 160 shown in FIG. 1B is a flexible material. In this embodiment, layer 160 is a permanent magnet material. The permanent magnet material is not required to be particularly magnetically strong because fields are only required to be less than about 300 Oe. The permanent magnet material of layer 160 provides the proper bias field for the magnetostrictive Fe-based alloy. The permanent magnet may be a long thin Alnico magnet material or alternatively a thin coat of common ferrite material in a rubber-like matrix. As with the embodiment of FIG. 1A, the first and second layers 110 and 160 may be joined by means of welding, brazing, soldering, or any other means of adhesion. Although FIG. 1B shows the bimetallic strip 100 being substantially rectangular, the strip may have any shape associated with bimetallic strips in general. Additionally, the size and the dimensions of the strip and its components may vary depending on the application.

FIGS. 2A, 2B, and 2C show bimetallic strips according to other embodiments of the invention. FIGS. 2A, 2B, and 2C show bimetallic strips 200, 250, and 275 respectively, each having three or more layers. Each bimetallic strip is composed of the two strips (elements) of FIG. 1A, and one or more permanent magnetic strips. FIG. 2A shows a three layer bimetallic strip 200 in which a permanent magnet material layer 140 is added to the bimetallic strip arrangement (110, 120) of FIG. 1A. Although, FIG. 2A shows the permanent magnet material layer attached to the Fe-based alloy 110, the permanent magnet material may alternatively attached to layer 120, thereby sandwiching the negative magnetostrictive layer 120 between layers 110 and 140. FIG. 2B shows a four layer bimetallic strip 250 in which permanent magnet material layers 140 sandwich the bimetallic strip arrangement (110, 120) of FIG. 1A. FIG. 2C shows a three layer bimetallic strip 275 in which a permanent magnet material layer is positioned between the Fe-based alloy layer 110, and the negative magnetostrictive layer 120. In each bimetallic strip (200, 250, 275), the alloys can be trained by stress and or magnetic field annealing to obtain the best magnetic domain configuration to maximize energy transfer. Additionally, as stated above, although FIGS. 2A, 2B, and 2C show the bimetallic strips being substantially rectangular, the strip may have any shape associated with bimetallic strips in general. Additionally, the size and the dimensions of the strips and their components may vary depending on the application.

Figure 3B:
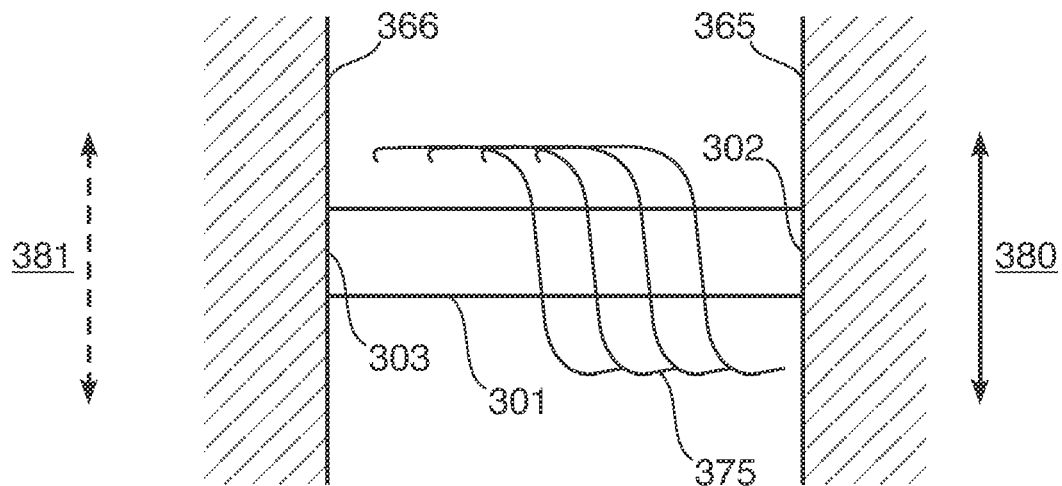
FIG. 3B is a schematic illustration of an energy harvesting arrangement according to an embodiment of the invention.
Figure 3C:
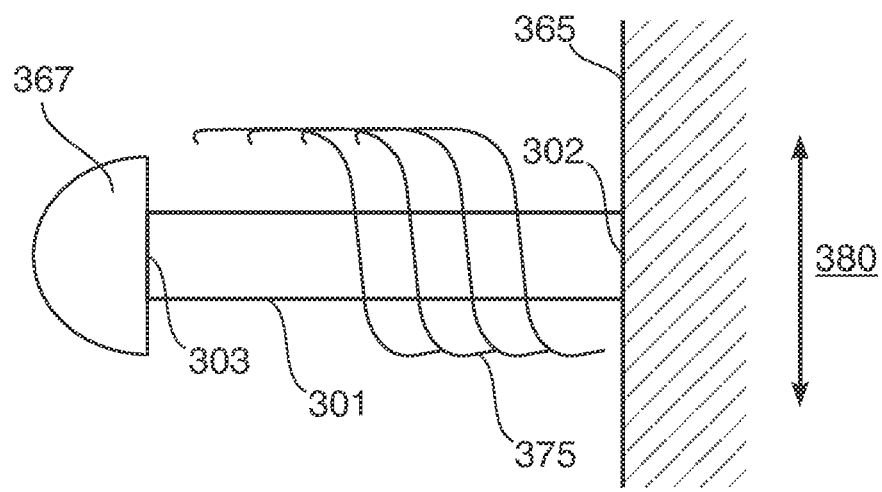
FIG. 3C is a schematic illustration of an energy harvesting arrangement according to an embodiment of the invention.
Figure 3A:
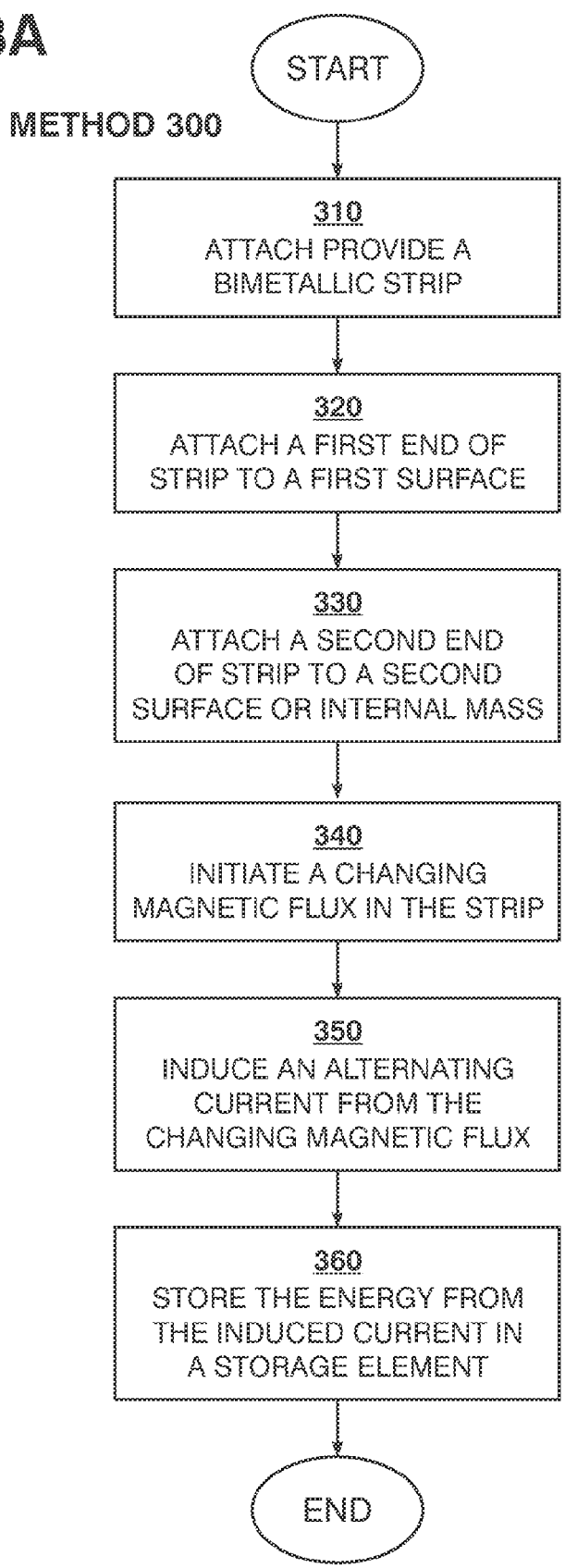
FIG. 3A is method of harvesting energy according to an embodiment of the invention.

FIGS. 3A, 3B, and 3C illustrate a method 300 of harvesting energy according to an embodiment of the invention. FIG. 3A shows a flowchart of the method 300, and FIGS. 3B and 3C schematically show the arrangement of elements of the energy harvesting method. Step 310 is the providing of a bimetallic strip 301 having a first end 302 and a second end 303. According to the method 300, the bimetallic strip 301 may have a structure according to any of the embodiments as outlined with respect to FIGS. 1A, 1B, 2A, 2B, and 2C. For example, if bimetallic strip 301 has a structure as outlined with respect to FIG. 1A, then the strip has a first substantially flat layer that may be $Fe_{100-x}Al_x$ wherein x is from about 5 to about 25, or $Fe_{100-y}Ga_y$ wherein y is from about 5 to about 35, or a combination thereof. As outlined above, each of the above outlined Fe-based alloy layers may optionally include one or more additional elements, such as carbon (C), manganese (Mn), sulfur (S), beryllium (Be), or Tin (Sn). The strip would also have a second substantially flat layer that has negative magnetostrictive properties. The second layer may be nickel (Ni) or an appropriate Ni alloy, or any other alloy having negative magnetostrictive properties.

Step 320 is the attaching of the first end 302 of the bimetallic strip 301 to a first surface 365. The first surface is a surface that is positioned within a vibration rich environment. For example, the first surface 365 may exist in an aircraft or automotive environment. The first surface 365 may also be associated with a common household appliance, such as a refrigerator, a washing machine, microwave oven. The surface may also, for example, be associated with industrial equipment, buildings, or bridges.

Step 330 is the attaching of the second end 303 of the bimetallic strip 301 to a second surface 366. The second surface may also be a surface located within a vibration rich environment. At step 330, the second end 303 may also be attached to an inertial mass 367. Any known bonding or means of adhesive may be used to attach the strips to the respective surfaces and/or mass.

Step 340 is the initiating of a changing magnetic arrangement and accompanying changing magnetic flux in the bimetallic strip 301. This is accomplished by vibrating the first surface to produce a mechanical stress in the bimetallic strip. FIGS. 3B and 3C show the first surface vibrating in direction 380. However, vibration may take place in other directions. In FIG. 3B, the second surface may be stationary or may optionally vibrate as shown by arrow 381. The vibrating of the surface may be initiated by mechanical means within the vibration rich environment. For example, if the first surface is in an aircraft or automobile, the vibrating of the surface may result from starting an engine. If for example, the surface is on a bridge, the vibration may result from natural means such as winds and/or water currents, or by other means such as the transportation of vehicles across the bridge.

Because of the manner in which the bimetallic strip 301 is secured as shown in FIGS. 3B and 3C, the strip undergoes mechanical stress due to the vibration. Because the bimetallic strip comprises magnetostrictive materials, the resulting mechanical stress rearranges the magnetic makeup of the strip, as well as the associated magnetic flux.

Step 350 is the inducing of an alternating current from the changing magnetic flux. As shown in FIGS. 3B and 3C, a coil 375a wrapped around the bimetallic strip 301. An alternating current is induced in the coil as a result of the changing magnetic flux of the strip 301, which is caused by the mechanical stresses and resulting alterations in the bimetallic strip. Although the coil 375 is shown in one orientation, the coil may be positioned in other orientations to maximize the induction of the current. At step 360, the induced current is stored via an electrical storage element. Alternatively, the induced current may be converted to another desired output using the appropriate circuitry. The energy harvesting method 300 is maximized by matching the bimetallic strip components and dimensions to the vibration amplitude and stress capability of the energy source.

A number of exemplary implementations have been described. Nevertheless, it will be understood that various modifications may be made. For example, suitable results may be achieved if the steps of described techniques are performed in a different order and/or if components in a described component, system, architecture, or devices are combined in a different manner and/or replaced or supplemented by other components. For example, the Fe-based alloy for use in the bimetallic strips, may not necessarily be limited to Fe—Al or Fe—Ga, but other elements may be used for ease of alloy preparation, modification of device temperature dependence, and other auxiliary effects. Accordingly, other implementations are within the scope of the following claims.

What is claimed is:

1. A bimetallic strip having only two layers, said bimetallic strip comprising:
a first substantially flat layer comprising a positive magnetostrictive material; and
a second substantially flat layer attached to the first substantially flat layer forming a dual layered strip, said second substantially flat layer comprising a flexible material,
wherein the first substantially flat layer comprises one of, an alloy of Fe and Al, wherein the alloy of Fe and Al comprises $Fe_{100-x}Al_x$ wherein x is from about 5 to about 25, an alloy of Fe and Ga, wherein the alloy of Fe and Ga comprises $Fe_{100-y}Ga_y$, wherein y is from about 5 to about 35, and an alloy that is a combination of $Fe_{100-x}Al_x$ wherein x is from about 5 to about 25, and $Fe_{100-y}Ga_y$, wherein y is from about 5 to about 35,
and wherein the flexible material of said second substantially flat layer comprises a negative magnetostrictive material or a permanent magnet.

2. The bimetallic strip of claim 1, wherein said first substantially flat layer comprises said alloy of Fe and Al and is provided in an alloy having a substantial amount of said $Fe_{100-x}Al_x$.

3. The bimetallic strip of claim 1, wherein said first substantially flat layer comprises said alloy of Fe and Ga and further comprises carbon.

4. The bimetallic strip of claim 1, wherein said first substantially flat layer comprises said alloy of Fe and Ga and is provided in an alloy having a substantial amount of said $Fe_{100-y}Ga_y$.

5. The bimetallic strip of claim 1, wherein said first substantially flat layer comprises said alloy of Fe and Ga the flexible material of said second substantially flat layer comprises Ni or a permanent magnet, and wherein said first substantially flat layer further comprises C, Mn, S, Be, Sn, or a combination thereof.

6. A bimetallic strip comprising:
a first substantially flat layer comprising a positive magnetostrictive material;
a second substantially flat layer attached to the first substantially flat layer forming a dual layered strip, said second substantially flat layer comprising a flexible material; and
a third substantially flat layer attached to one of said first substantially flat layer or said second substantially flat layer, wherein said third substantially flat layer comprises a permanent magnet, and wherein said first, said second, and said third substantially flat layers are attached so that there are no air gaps within the bimetallic strip.

7. The bimetallic strip of claim 6, wherein said second substantially flat layer comprises a negative magnetostrictive material; and said first substantially flat layer comprises an Fe-based alloy, wherein said Fe-based alloy comprises; $Fe_{100-x}Al_x$ wherein x is from about 5 to about 25, or $Fe_{100-y}Ga_y$, wherein y is from about 5 to about 35, or a combination of said $Fe_{100-x}Al_x$ and said $Fe_{100-y}Ga_y$.

8. The bimetallic strip of claim 7 wherein, said Fe-based alloy is provided in an alloy having a substantial amount of said Fe-based alloy.

9. The bimetallic strip of claim 7, wherein said first substantially flat layer further comprises C, Mn, S, Be, Sn, or a combination thereof.

10. The bimetallic strip of claim 6, further comprising:
a fourth substantially flat layer attached to one of said first substantially flat layer or said second substantially flat layer, so that said first and second substantially flat layers are sandwiched between said third substantially flat layer and said fourth substantially flat layers, wherein said fourth substantially flat layer comprises a permanent magnet.

11. The bimetallic strip of claim 10 wherein,
said second substantially flat layer comprises a negative magnetostrictive material; and
said first substantially flat layer comprises an Fe-based alloy, wherein said Fe-based alloy comprises; $Fe_{100-x}Al_x$ wherein x is from about 5 to about 25, or $Fe_{100-y}Ga_y$ wherein y is from about 5 to about 35, or a combination of said $Fe_{100-x}Al_x$ and said $Fe_{100-y}Ga_y$.

12. The bimetallic strip of claim 11 wherein, said Fe-based alloy is provided in an alloy having a substantial amount of said Fe-based alloy.

13. The bimetallic strip of claim 11, wherein said first substantially flat layer further comprises C, Mn, S, Be, Sn, or a combination thereof.

14. A bimetallic strip comprising:
a first substantially flat layer comprising a positive magnetostrictive material; a second substantially flat layer attached to the first substantially flat layer forming a dual layered strip, said second substantially flat layer comprising a flexible material; and
a third substantially flat layer attached to the second substantially flat layer, so that said second substantially flat layer is sandwiched between said first substantially flat layer and said third substantially flat layer, wherein said second substantially flat layer comprises a permanent magnet, and said third substantially flat layer comprises a flexible material, and wherein said first, said second, and said third substantially flat layers are attached so that there are no air gaps within the bimetallic strip.

15. The bimetallic strip of claim 14, wherein
said third substantially flat layer comprises a negative magnetostrictive material; and said first substantially flat layer comprises an Fe-based alloy, wherein said Fe-based alloy comprises; $Fe_{100-x}Al_x$ x is from about 5 to about 25, or $Fe_{100-y}Ga_y$ wherein y is from about 5 to about 35, or a combination of said $Fe_{100-x}Al_x$ and said $Fe_{100-y}Ga_y$.

16. The bimetallic strip of claim 15, wherein said Fe-based alloy is provided in an alloy having a substantial amount of said Fe-based alloy.

* * * * *